United States Patent
Oh et al.

(10) Patent No.: US 8,671,564 B2
(45) Date of Patent: Mar. 18, 2014

(54) SUBSTRATE FOR FLIP CHIP BONDING AND METHOD OF FABRICATING THE SAME

(75) Inventors: Hueng Jae Oh, Gyunggi-do (KR); Tae Joon Chung, Seoul (KR); Dong Gyu Lee, Gyunggi-do (KR); Seon Jae Mun, Gyunggi-do (KR); Jin Won Choi, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 324 days.

(21) Appl. No.: 12/554,762

(22) Filed: Sep. 4, 2009

(65) Prior Publication Data
US 2010/0314161 A1 Dec. 16, 2010

(30) Foreign Application Priority Data

Jun. 10, 2009 (KR) ........................ 10-2009-0051605

(51) Int. Cl.
*H01K 3/10* (2006.01)
(52) U.S. Cl.
USPC ............................................. 29/852; 29/842
(58) Field of Classification Search
USPC ............... 174/257, 250, 255, 261–264; 29/829–831, 842, 846, 852; 361/760, 361/761, 784
See application file for complete search history.

(56) References Cited

U.S. PATENT DOCUMENTS

| 2007/0187136 A1* | 8/2007 | Higashiguchi et al. ....... 174/250 |
| 2009/0114431 A1* | 5/2009 | Kuroda et al. ................. 174/257 |
| 2009/0174081 A1* | 7/2009 | Furuta ............................ 257/777 |
| 2009/0302463 A1* | 12/2009 | Gallegos et al. ............. 257/737 |

FOREIGN PATENT DOCUMENTS

| JP | 2003-037210 | 2/2003 |
| KR | 1020030081172 | 10/2003 |
| KR | 1020080072542 | 8/2008 |

OTHER PUBLICATIONS

Office Action from counterpart Korean Patent Application No. 10-2009-0051605, Jan. 19, 2011, 5 pages.
Office Action from counterpart Korean Patent Application No. 10-2009-0051605, mailed Sep. 27, 2011, 5 pages.

* cited by examiner

*Primary Examiner* — Jeremy Norris
*Assistant Examiner* — Tremesha S Willis
(74) *Attorney, Agent, or Firm* — Bracewell & Giuliani LLP

(57) ABSTRACT

Disclosed is a substrate for flip chip bonding, in which a base solder layer is formed between a pad and a metal post, thereby increasing impact resistance and mounting reliability. A method of fabricating the substrate for flip chip bonding is also provided.

8 Claims, 7 Drawing Sheets

SUBSTRATE FOR FLIP CHIP BONDING AND METHOD OF FABRICATING THE SAME

CROSS REFERENCE TO RELATED APPLICATION

This application claims the benefit of Korean Patent Application No. 10-2009-0051605, filed Jun. 10, 2009, entitled "Substrate of flip chip and fabricating method of the same", which is hereby incorporated by reference in its entirety into this application.

BACKGROUND OF THE INVENTION

1. Technical Field

The present invention relates to a substrate for flip chip bonding and a method of fabricating the same.

2. Description of the Related Art

With the recent advancement of the electronics industry, there is a demand for increasing performance and functionality of electronic components and reducing the size thereof. Accordingly, high integration, slimness and fine circuit patterning are also required on a substrate for surface mounting components, such as SIP (System in Package), 3D package, etc.

In particular, in techniques for mounting electronic components on the surface of a substrate, a wire bonding process or a flip chip bonding process is utilized for forming an electrical connection between a semiconductor chip and a printed circuit board (PCB). In the case of the wire bonding process, because the connection of the chip to the PCB is performed using a wire, the size of a module is increased and an additional process is required. As well, limitations are imposed on realizing a circuit pattern having a fine pitch. So, the flip chip bonding process is mainly employed.

The flip chip bonding process includes forming an external connection terminal (i.e. a bump) having a size of tens of μm to hundreds of μm on a semiconductor chip using a material such as gold, solder or another metal, flipping the semiconductor chip having the bump so that the surface thereof faces the substrate, and mounting the semiconductor chip on the substrate, unlike the mounting operation based on the wire bonding.

Moreover, in order to correspond to a circuit pattern having an ultrafine pitch, the flip chip bonding process is developed to form a new structure using a metal post. The use of such a metal post is receiving attention as an alternative for achieving a fine pitch, ensuring a distance between a PCB and a semiconductor chip to thus facilitate the fabrication of a package, and improving heat dissipation performance.

FIG. 1 is a cross-sectional view showing a semiconductor substrate for flip chip bonding according to a conventional technique.

As shown in FIG. 1, the semiconductor substrate 10 for flip chip bonding according to the conventional technique includes a silicon wafer 12 having pads 14, a solder resist layer 16 formed on the silicon wafer 12 and having open portions for exposing the pads 14, metal posts 18 formed on the pads 14, and solder bumps 20 formed on the metal posts 18.

Although the semiconductor substrate 10 for flip chip bonding according to the conventional technique is evaluated to be superior in terms of height uniformity and mounting reliability, it is not easy to relieve stress applied to the metal posts 18, and thus the metal posts 18 suffer from necking defects and mounting reliability is reduced.

As well, the above metal post structure employed in the conventional semiconductor substrate has a limitation in applying it to a package substrate on which the semiconductor substrate 10 is mounted. This is because the formation of the metal posts having the same height is difficult when the metal posts are plated on the package substrate which warps in the manufacturing process unlike the silicon wafer 12.

SUMMARY OF THE INVENTION

Accordingly, the present invention has been made keeping in mind the problems encountered in the related art and the present invention intends to provide a substrate for flip chip bonding, which has improved impact resistance and mounting reliability, and a method of fabricating the same.

The present invention also intends to provide a substrate for flip chip bonding, which includes metal posts applicable not only to a semiconductor substrate but also to a package substrate, and a method of fabricating the same.

An aspect of the present invention provides a substrate for flip chip bonding, including a base substrate having a pad, a solder resist layer formed on the base substrate to expose the pad, a base solder layer formed on the pad, and a metal post formed on the base solder layer.

The base substrate may be a semiconductor substrate.

Also, a first surface treatment layer may be formed between the base solder layer and the metal post, the first surface treatment layer being composed of a nickel plating layer or a nickel alloy plating layer with or without thereon any one selected from among a palladium plating layer, a gold plating layer and sequentially disposed palladium plating layer and gold plating layer.

Also, a first $Ni_x$—$Sn_y$-based intermetallic compound layer may be formed at an interface between the base solder layer and the first surface treatment layer.

Also, a solder cap may be formed on the metal post.

Also, a second surface treatment layer may be formed between the metal post and the solder cap, the second surface treatment layer being composed of a nickel plating layer or a nickel alloy plating layer with or without thereon any one selected from among a palladium plating layer, a gold plating layer and sequentially disposed palladium plating layer and gold plating layer.

Also, a second $Ni_x$—$Sn_y$-based intermetallic compound layer may be formed at an interface between the second surface treatment layer and the solder cap.

Also, an outer surface treatment layer may be formed on an outer surface of the metal post.

Another aspect of the present invention provides a method of fabricating the substrate for flip chip bonding, including (A) forming on a base substrate having a pad a solder resist layer having an open portion for exposing the pad, (B) applying a photosensitive resist on the solder resist layer and the exposed pad, and forming an opening in the photosensitive resist to expose the pad, (C) filling a part of the opening with a solder paste, thus forming a base solder layer connected to the pad, (D) forming a metal post connected to the base solder layer in the opening, and (E) removing the photosensitive resist.

As such, the base substrate may be a semiconductor substrate.

Also, (C1) forming a first surface treatment layer on the base solder layer may be performed between (C) and (D), the first surface treatment layer being composed of a nickel plating layer or a nickel alloy plating layer with or without thereon any one selected from among a palladium plating layer, a gold plating layer and sequentially disposed palladium plating layer and gold plating layer.

Also, a first $Ni_x$—$Sn_y$-based intermetallic compound layer may be formed at an interface between the base solder layer and the first surface treatment layer.

Also, (D1) applying a solder paste on the metal post thus forming a solder cap may be performed between (D) and (E).

Also, (D2) forming a second surface treatment layer on the metal post may be performed between (D) and (D1), the second surface treatment layer being composed of a nickel plating layer or a nickel alloy plating layer with or without thereon any one selected from among a palladium plating layer, a gold plating layer and sequentially disposed palladium plating layer and gold plating layer.

Also, a second $Ni_x$—$Sn_y$-based intermetallic compound layer may be formed at an interface between the metal post and the second surface treatment layer.

Also, (E1) forming an outer surface treatment layer on an outer surface of the metal post may be performed after (E).

BRIEF DESCRIPTION OF THE DRAWINGS

The features and advantages of the present invention will be more clearly understood from the following detailed description taken in conjunction with the accompanying drawings.

DESCRIPTION OF SPECIFIC EMBODIMENTS

Figure 1:
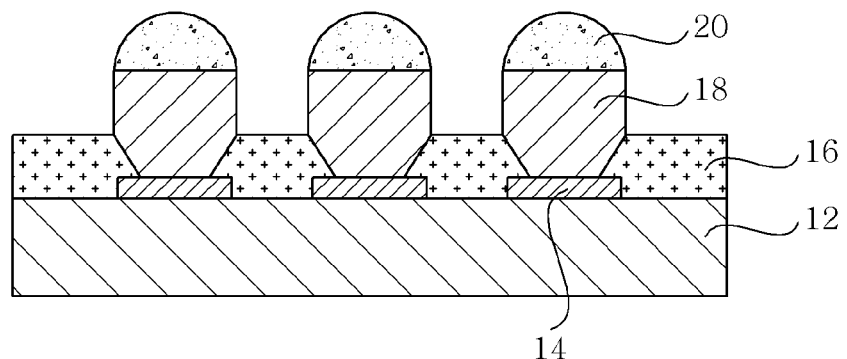
FIG. 1 is a cross-sectional view showing a semiconductor substrate for flip chip bonding according to a conventional technique.

The objects, specific advantages and novel features of the present invention will be more clearly understood from the following detailed description and embodiments taken in conjunction with the accompanying drawings. Throughout the drawings, the same reference numerals refer to the same or similar elements, and redundant descriptions are omitted. Also, in the case where known techniques pertaining to the present invention are regarded as unnecessary because they make the characteristics of the invention unclear and also for the sake of description, the detailed description thereof may be omitted. Furthermore, the terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept implied by the term to best describe the method he or she knows for carrying out the invention.

Hereinafter, a detailed description will be given of embodiments of the present invention, with reference to the accompanying drawings.

Substrate for Flip Chip Bonding

1st Embodiment

Figure 2:
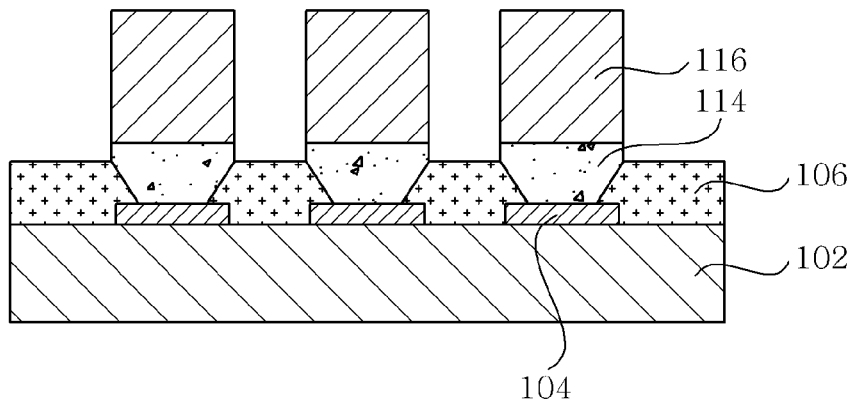
FIG. 2 is a cross-sectional view showing a substrate for flip chip bonding according to a first embodiment of the present invention.

FIG. 2 is a cross-sectional view showing the substrate having metal posts according to a first embodiment of the present invention. Below, the substrate 100a having the metal posts according to the present embodiment is described with reference to the above drawing.

As seen in FIG. 2, the substrate 100a for flip chip bonding according to the present embodiment includes a base substrate 102, a solder resist layer 106, a base solder layer 114, and metal posts 116.

The base substrate 102 has pads 104 formed thereon, and the solder resist layer 106 having open portions 108 for exposing the pads 104 is formed on the base substrate 102. Examples of the base substrate 102 may include a semiconductor substrate and a package substrate.

The base solder layer 114 functions to relieve impact applied to the metal posts 116 and improve height uniformity and mounting reliability, and is formed on the pads 104.

The metal posts 116 enable the fine pitching of a wiring pattern and the fast signal transfer between a substrate and a semiconductor chip, ensure a distance between chips, and perform a heat dissipation function. The metal posts 116 are formed to protrude from the upper surface of the solder resist layer 106 while being connected to the base solder layer 114. The metal posts 116 may have a cylindrical shape, and may be formed of a material such as copper (Cu), nickel (Ni), tin (Sn) or gold (Au).

Also, in order to enhance the force of adhesion between the base solder layer 114 and the metal posts 116, a first surface treatment layer (not shown) is thinly formed therebetween, which is composed of a Ni plating layer or a Ni alloy plating layer with or without thereon any one selected from among a palladium (Pd) plating layer, an Au plating layer and sequentially disposed Pd plating layer and Au plating layer.

The first surface treatment layer is bonded with the base solder layer 114 made of Sn, thus forming a first $Ni_x$—$Sn_y$-based intermetallic compound (IMC) layer at the interface therebetween.

Furthermore, an outer surface treatment layer (not shown) may be formed on the outer surfaces of the metal posts 116 to prevent corrosion and oxidation thereof.

Substrate for Flip Chip Bonding

2nd Embodiment

Figure 3:
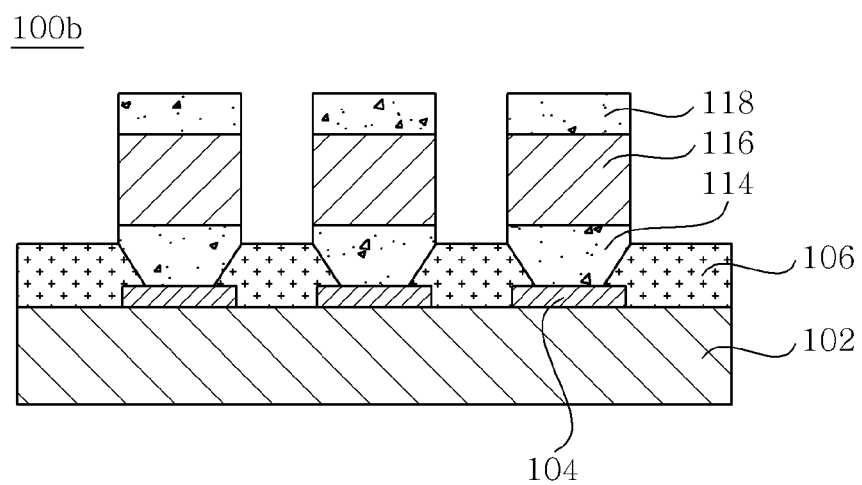
FIG. 3 is a cross-sectional view showing a substrate for flip chip bonding according to a second embodiment of the present invention.

FIG. 3 is a cross-sectional view showing a substrate for flip chip bonding according to a second embodiment of the present invention. In the description of the second embodiment, elements which are the same as or similar to those of the first embodiment are designated by the same reference numerals, and redundant descriptions are omitted.

As shown in FIG. 3, the substrate 100b for flip chip bonding according to the second embodiment is configured such that solder caps 118 are formed on the metal posts 116 of the substrate 100a of FIG. 2.

The solder caps 118 produce a buffering effect upon packaging of the substrate for flip chip bonding and also assure height uniformity.

Also, in order to enhance the force of adhesion between the metal posts 116 and the solder caps 118, a second surface treatment layer (not shown) is thinly formed therebetween, which is composed of a Ni plating layer or a Ni alloy plating layer with or without thereon any one selected from among a Pd plating layer, an Au plating layer and sequentially disposed Pd plating layer and Au plating layer.

The second surface treatment layer is bonded with the solder caps 118 made of Sn, thus forming a second $Ni_x$—$Sn_y$-based IMC layer at the interface therebetween.

Furthermore, an outer surface treatment layer (not shown) may be formed on the outer surfaces of the metal posts 116 to prevent corrosion and oxidation thereof.

Method of Fabricating the Substrate for Flip Chip Bonding

1st Embodiment

FIGS. 4 to 9 are cross-sectional views sequentially showing the process of fabricating the substrate for flip chip bonding as shown in FIG. 2. Below, the method of fabricating the substrate 100a for flip chip bonding according to the present embodiment is described with reference to the above drawings.

Figure 4:
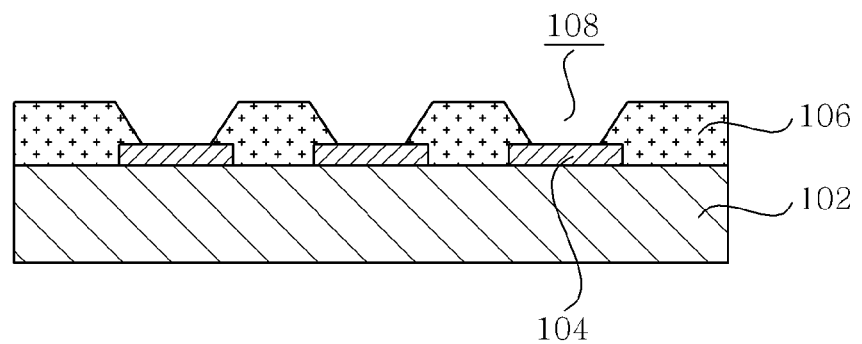
FIGS. 4 to 9 are cross-sectional views sequentially showing a process of fabricating the substrate for flip chip bonding of FIG. 2.

As shown in FIG. 4, the solder resist layer 106 is formed on the base substrate 102 having the pads 104, and the open portions 108 for exposing the pads 104 are formed in the solder resist layer 106. The open portions 108 may be formed through a mechanical process such as LDA (Laser Direct Ablation) or through UV light exposure and development.

Figure 5:
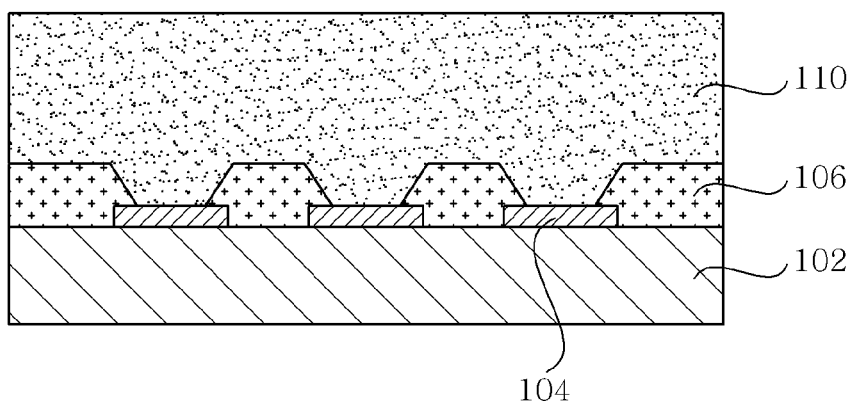

Next, as shown in FIG. 5, a photosensitive resist 110 is applied on the solder resist layer 106.

As the photosensitive resist 110, a high heat-resistant dry film may be used so as to endure a reflow process at high temperature of 260° C. or more, and may have a thickness of 60 μm or more to form post bumps having an appropriate height.

Figure 6:
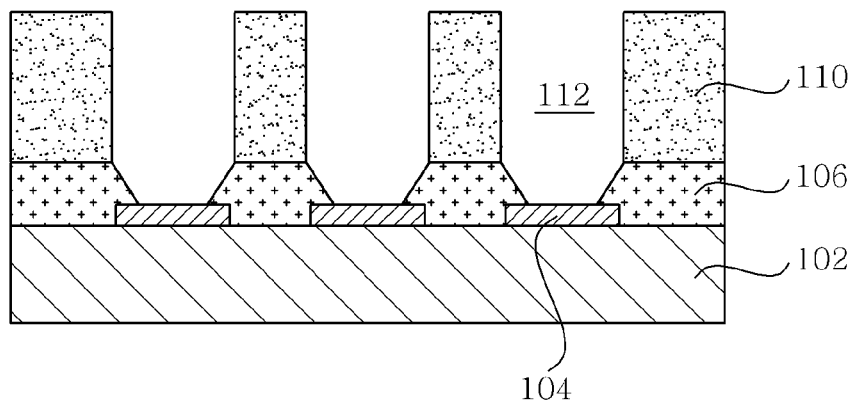

Next, as shown in FIG. 6, openings 112 for exposing the pads 104 are formed in the photosensitive resist 110 through exposure and development.

As such, the openings 112 are formed in a manner such that portions of the photosensitive resist 110 other than portions thereof applied on the pads 104 are exposed to UV light using a predetermined mask pattern (not shown) and the unexposed portions of the photosensitive resist 110 are removed using a developing solution such as sodium carbonate ($Na_2CO_3$) or potassium carbonate ($K_2CO_3$).

Figure 7:
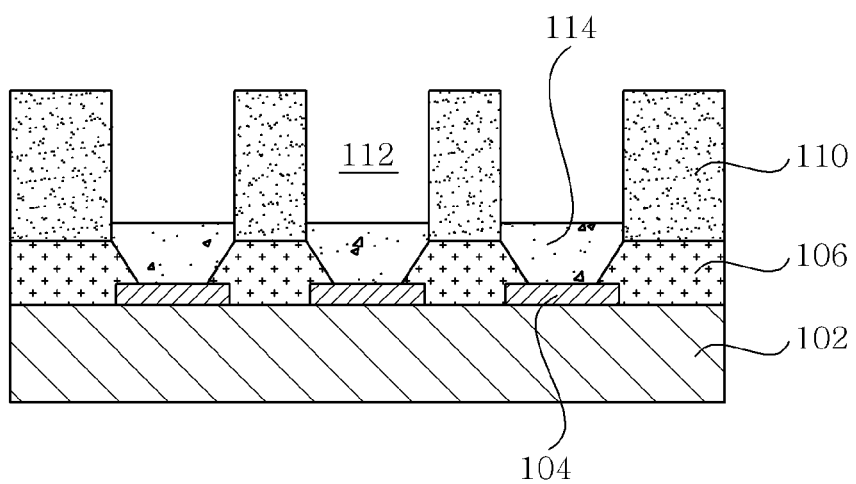

Next, as shown in FIG. 7, a solder paste is applied on the pads 104 exposed by the openings 112, thus forming the base solder layer 114.

The base solder layer 114 is formed in parts of the openings 112 through screen printing or the like.

Furthermore, the first surface treatment layer may be formed on the base solder layer 114 in order to enhance the force of adhesion between the metal posts 116 which are to be formed through a subsequent plating process and the base solder layer 114.

The first surface treatment layer may be composed of a Ni plating layer or a Ni alloy plating layer with or without thereon any one selected from among a Pd plating layer, an Au plating layer and sequentially disposed Pd plating layer and Au plating layer. The first surface treatment layer is bonded with the base solder layer 114 made of Sn, so that the first $Ni_x$—$Sn_y$-based IMC layer is formed at the interface therebetween.

Figure 8:
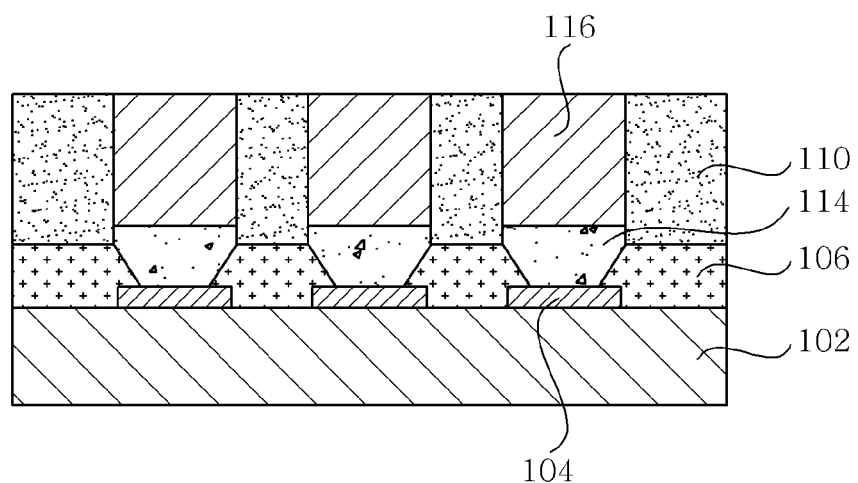

Next, as shown in FIG. 8, the metal posts 116 are formed in the openings 112.

The metal posts 116 are formed through Cu plating (including electroless Cu plating and Cu electroplating), and have the same height as that of the photosensitive resist 110.

Figure 9:
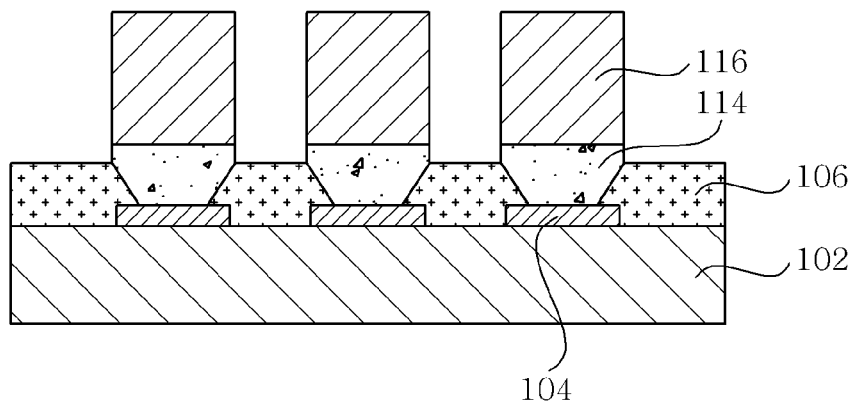

Finally, as shown in FIG. 9, the photosensitive resist 110 is stripped, thus manufacturing the substrate 100a for flip chip bonding as seen in FIG. 2.

As such, the photosensitive resist 110 may be stripped using a stripping solution such as NaOH or KOH. In the course of bonding the OH- of the stripping solution with the $COOH^+$ of the dry film resist, the exposed dry film resist may come off and may thus be stripped.

Furthermore, the outer surface treatment layer may be formed on the upper and outer surfaces of the metal posts 116 to prevent corrosion and oxidation thereof.

Method of Fabricating the Substrate for Flip Chip Bonding

2nd Embodiment

FIGS. 10 to 13 are cross-sectional views sequentially showing the process of fabricating the substrate for flip chip bonding as shown in FIG. 3. In the description of the present embodiment, redundant descriptions for fabrication procedures which are the same as or corresponding to those of the prior embodiment are omitted. Below, the method of fabricating the substrate for flip chip bonding according to the present embodiment is described with reference to the above drawings.

Figure 10:
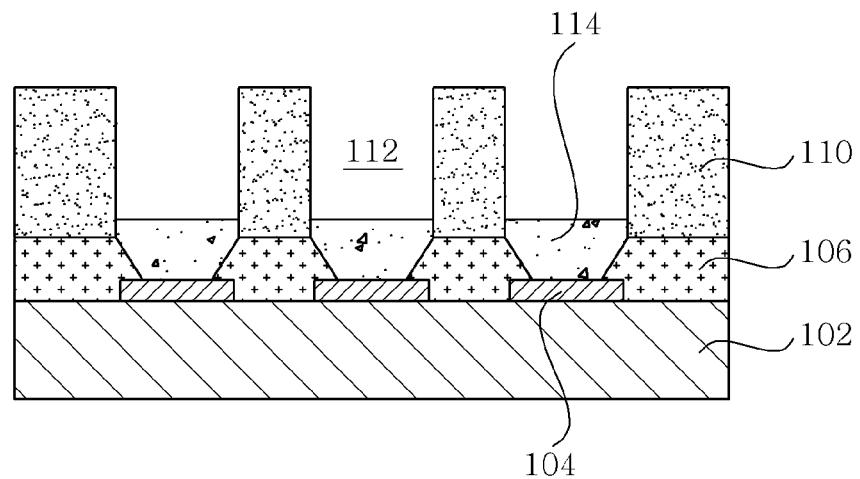
FIGS. 10 to 13 are cross-sectional views sequentially showing a process of fabricating the substrate for flip chip bonding of FIG. 3.

As shown in FIG. 10, a solder paste is applied on the pads 104 exposed by the openings 112 as shown in FIG. 7 so that parts of the openings are filled therewith, thus preparing the base substrate 102 having the base solder layer 114.

Figure 11:
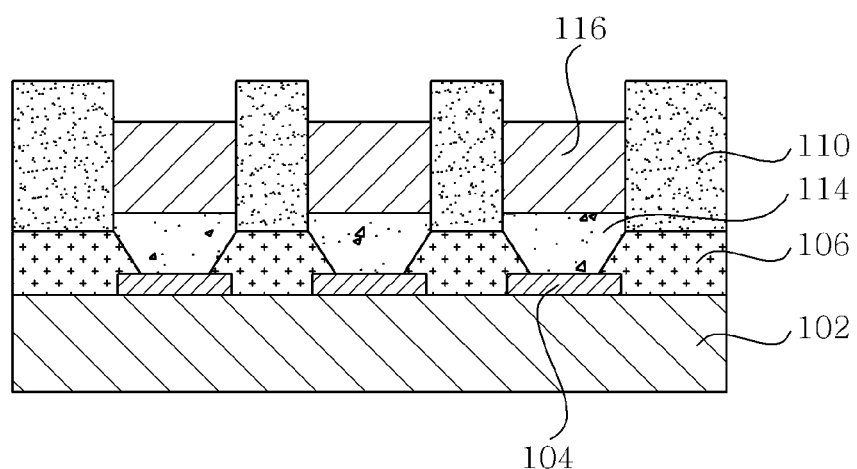

Next, as shown in FIG. 11, the metal posts 116 are formed on the base solder layer 114 so that the parts of the openings 112 are further filled therewith.

Also, the second surface treatment layer may be formed on the metal posts 116 in order to enhance the force of adhesion of the metal posts 116 to the solder caps 118.

The second surface treatment layer may be composed of a Ni plating layer or a Ni alloy plating layer with or without thereon any one selected from among a Pd plating layer, an Au plating layer and sequentially disposed Pd plating layer and Au plating layer. The second surface treatment layer is bonded with the solder caps 118 made of Sn, thus forming the second $Ni_x$—$Sn_y$-based IMC layer at the interface therebetween.

Figure 12:
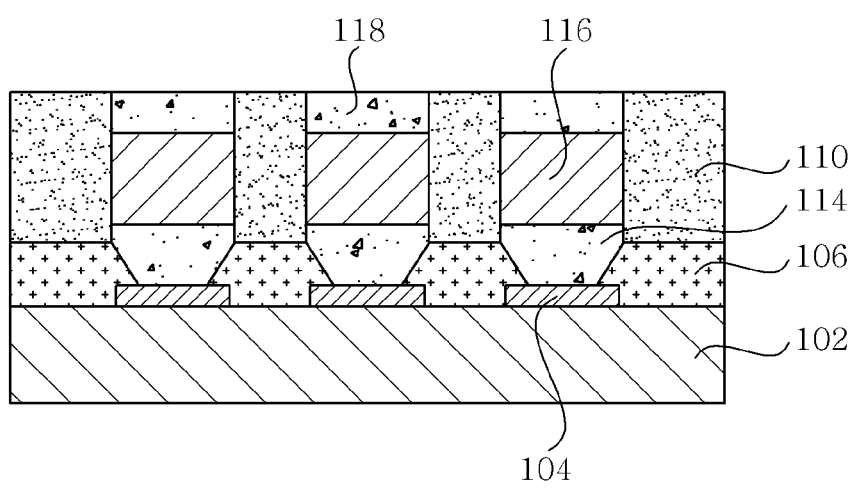

Next, as shown in FIG. 12, a solder paste is printed on the metal posts 116 exposed by the openings 112, thus forming the solder caps 118.

Figure 13:
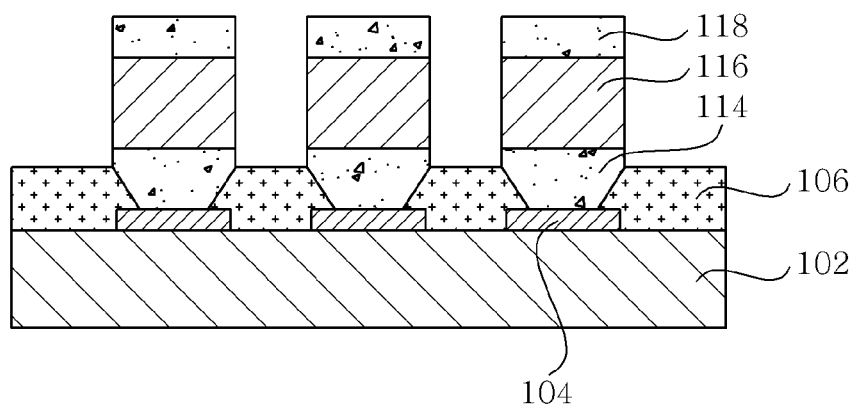

Finally, as shown in FIG. 13, the photosensitive resist 110 is stripped, thus manufacturing the substrate 100b for flip chip bonding as seen in FIG. 3.

As described hereinbefore, the present invention provides a substrate for flip chip bonding and a method of fabricating the same. According to the present invention, a base solder layer producing a buffering effect owing to its high softness is formed under metal posts, thus increasing impact resistance, thereby reducing the generation of necking defects on copper posts.

Also, according to the present invention, the base solder layer and/or solder caps are used, thus solving problems of height and position non-uniformity, thereby reducing the generation of mounting defects.

Also, according to the present invention, the base solder layer producing a buffering effect and/or the solder caps are used, thus forming metal posts having improved height uniformity and mounting reliability not only on a semiconductor substrate but also on a package substrate.

Although the embodiments of the present invention regarding the substrate for flip chip bonding and the method of fabricating the same have been disclosed for illustrative purposes, those skilled in the art will appreciate that various modifications, additions and substitutions are possible, without departing from the scope and spirit of the invention as disclosed in the accompanying claims. Accordingly, such modifications, additions and substitutions should also be understood to fall within the scope of the present invention.

What is claimed is:

1. A method of fabricating a substrate for flip chip bonding, comprising:
    performing the following in sequence order:
    (A) forming on a base substrate having a pad a solder resist layer having an open portion for exposing the pad;
    (B) applying a photosensitive resist on the solder resist layer and the exposed pad, and forming an opening in the photosensitive resist to expose the pad;
    (C) filling a part of the opening with a solder paste, thus forming a base solder layer connected to the pad;
    (D) forming a metal post connected to the base solder layer in the opening, the metal post being formed as a substrate contact; and
    (E) removing the photosensitive resist,
    wherein, the base solder layer is provided at the interface of the pad and the metal post, and in area contact with them.

2. The method as set forth in claim 1, wherein the base substrate is a semiconductor substrate.

3. The method as set forth in claim 1, wherein (C1) forming a first surface treatment layer on the base solder layer is performed between (C) and (D), the first surface treatment layer being composed of a nickel plating layer or a nickel alloy plating layer with or without thereon any one selected from among a palladium plating layer, a gold plating layer and sequentially disposed palladium plating layer and gold plating layer.

4. The method as set forth in claim 3, wherein a first $Ni_x$—$Sn_y$-based intermetallic compound layer is formed at an interface between the base solder layer and the first surface treatment layer.

5. The method as set forth in claim 1, wherein (D1) applying a solder paste on the metal post thus forming a solder cap is performed between (D) and (E).

6. The method as set forth in claim 5, wherein (D2) forming a second surface treatment layer on the metal post is performed between (D) and (D1), the second surface treatment layer being composed of a nickel plating layer or a nickel alloy plating layer with or without thereon any one selected from among a palladium plating layer, a gold plating layer and sequentially disposed palladium plating layer and gold plating layer.

7. The method as set forth in claim 6, wherein a second $Ni_x$—$Sn_y$-based intermetallic compound layer is formed at an interface between the metal post and the second surface treatment layer.

8. The method as set forth in claim 1, wherein (E1) forming an outer surface treatment layer on an outer surface of the metal post is performed after (E).

* * * * *